United States Patent
Tanaka et al.

(10) Patent No.: US 6,859,096 B2
(45) Date of Patent: Feb. 22, 2005

(54) CLASS D AMPLIFIER

(75) Inventors: Yasuomi Tanaka, Hamakita (JP); Masao Noro, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 3 days.

(21) Appl. No.: 10/630,561

(22) Filed: Jul. 30, 2003

(65) Prior Publication Data

US 2004/0061552 A1 Apr. 1, 2004

(30) Foreign Application Priority Data

Jul. 31, 2002 (JP) ..................... P.2002-223606

(51) Int. Cl.[7] .............................................. H03F 3/38
(52) U.S. Cl. ....................... 330/10; 330/207 A; 330/251
(58) Field of Search ............................. 330/10, 207 A, 330/251; 375/238

(56) References Cited

U.S. PATENT DOCUMENTS

| | | | | |
|---|---|---|---|---|
| 4,649,565 A | * | 3/1987 | Kaizer et al. ............... | 330/251 |
| 5,617,058 A | * | 4/1997 | Adrian et al. ................ | 330/10 |
| 6,091,292 A | * | 7/2000 | Higashiyama et al. ........ | 330/10 |
| 6,414,614 B1 | * | 7/2002 | Melanson .................... | 330/10 |

* cited by examiner

Primary Examiner—Khanh V. Nguyen
(74) Attorney, Agent, or Firm—Pillsbury Winthrop LLP

(57) ABSTRACT

A detecting circuit (REFH, CM11, LA1, TN1, RN1) which detects an overcurrent flowing through a power-MOS transistor (401) in an output stage to output a first signal (ITN1) is disposed in a first driving circuit (303H) on the side of a high-side driver. Another detecting circuit (REFL, CM21, LA2, TN2, RN2) which detects an overcurrent flowing through a power-MOS transistor (402) in the output stage to output a second signal (ITN2) is disposed in a driving circuit (303L) on the side of a low-side driver. The first signal (ITN1) is converted to a third signal (ITT2) based on a negative power supply (VPP−), by a signal converting circuit. The third signal is added to the second signal. In response to the addition signal, a pulse signal to be input to the driving circuits (303H and 303L) is blocked.

5 Claims, 7 Drawing Sheets

CLASS D AMPLIFIER

BACKGROUND OF THE INVENTION

The present invention relates to a class D amplifier (digital amplifier) which converts an analog signal such as a music signal to a pulse signal, and power-amplifies the signal, and more particularly to a circuit technique for driving and controlling output power MOS-transistors.

Conventionally, a class D amplifier is known which receives an analog signal such as a music signal as an input signal, converts the signal to a pulse signal, and then power-amplifies the signal. An output terminal of the amplifier is connected to an input terminal of a loudspeaker via a low-pass filter. In such a class D amplifier, a pulse signal is power-amplified while reflecting the amplitude of the input signal to the pulse width, and the pulse signal is output. The pulse signal is then passed through the external low-pass filter, whereby the analog music signal is extracted, so that the loudspeaker is driven by the signal. A class D amplifier can be formed on a silicon chip, and hence is widely used in a portable terminal device or a personal computer which is requested to consume a small power.

A conventional class D amplifier will be described with reference to FIG. 1. Referring to the figure, a signal source SIG is a source of an analog music signal VIN in which the midpoint of the amplitude is set to the ground potential (0 V), and connected to an input terminal TI via an input capacitor CIN. The class D amplifier is a so-called PWM amplifier (PWM: Pulse Width Modulation), and configured by an input stage 100, a modulating circuit 200, a drive controlling circuit 300, and n-type power-MOS transistors 401 and 402.

The input stage 100 converts the waveform of the music signal VIN to a voltage (amplitude) conforming to the input characteristics of the modulating circuit 200. The modulating circuit 200 is disposed subsequently to the input stage, and converts the music signal supplied from the input stage 100 to a pulse signal (PWM modulation). On the basis of the modulated pulse signal, the drive controlling circuit 300 complementarily drives the output power-MOS transistors 401 and 402. The power-MOS transistor 401 is used for outputting a high level, and the power-MOS transistor 402 for outputting a low level. An input terminal of a loudspeaker SPK is connected to an output terminal TO via a low-pass filter consisting of an inductor L and a capacitor C.

In the class D amplifier, the music signal VIN supplied from the signal source SIG is passed through the input stage 100 and the modulating circuit 200 to be converted to a pulse signal. On the basis of the modulated pulse signal, the drive controlling circuit 300 complementarily controls the conduction states of the power-MOS transistors 401 and 402, and outputs the power-amplified pulse signal to the output terminal TO. In the power-amplified pulse signal, the carrier frequency component is removed away by the low-pass filter consisting of the inductor L and the capacitor C, and then the signal is supplied to the loudspeaker SPK.

The modulating circuit 200 is configured so as to be operated by a single power supply VDD (for example, 10 V). Consequently, the low level of the pulse signal which is the output signal of the circuit is equal to the ground potential (0 V), and the high level is equal to the voltage (10 V) supplied from the power supply VDD. Therefore, when the pulse signal having such signal levels is used as it is, the power-MOS transistor 401 in which the drain is connected to a positive power supply VPP+ (for example, +50 V) cannot be sufficiently controlled to the on state because of the characteristics of a MOS transistor, and the power-MOS transistor 402 in which the source is connected to a negative power supply VPP− (for example, −50 V) cannot be sufficiently controlled to the off state. Therefore, the drive controlling circuit 300 is configured so as to be able to control the power-MOS transistors 401 and 402 on the basis of the pulse signal which is modulated in the modulating circuit 200, and comprises so-called high- and low-side drivers.

In an actual usage situation of a class D amplifier, a speaker terminal is formed as an external terminal, and there is the possibility that the output terminal is short-circuited to ground. In the case where the output terminal is short-circuited to ground, when a power-MOS transistor in the output stage is in the on state, an overcurrent which exceeds the allowable current flows through the power-MOS transistor, thereby causing a fear that the output stage is broken. Therefore, a countermeasure is taken to protect the power-MOS transistor in the output stage from an overcurrent.

FIG. 7 shows an example of a configuration for protecting a power-MOS transistor in the output stage from an overcurrent. Referring to the figure, signals H3 and H4 are signals respectively having the same and negative-phases as that of the pulse signal which is output from the above-mentioned modulating circuit 200, and the signals are used as input signals of the high-side driver. Signals L3 and L4 are signals respectively having the same and negative-phases as that of the pulse signal which is output from the modulating circuit 200, and the signals are used as input signals of the low-side driver. A driving circuit 303HJ functions as the high-side driver, and, on the basis of the signals H3 and H4, drives the power-MOS transistor 401. A driving circuit 303LJ functions as the low-side driver, and, on the basis of the signals L3 and L4, drives the power-MOS transistor 402.

A resistor RS1 is used for detecting a current flowing through the power-MOS transistor 401, and connected between the power-MOS transistor 401 and the output terminal TO. A resistor RS2 is used for detecting a current flowing through the power-MOS transistor 402, and connected between the power-MOS transistor 402 and the negative power supply VPP−. In the driving circuit 303HJ, a comparator CM1, an AND gate circuit AN1, and a buffer B14 are disposed so as to constitute a transfer path for the signals H3 and H4, and a comparator CM11 and a latch LA1 are disposed so as to constitute a circuit system for detecting an overcurrent. The non-inverting input of the comparator CM11 is connected to one end of the resistor RS1, and the inverting input terminal of the comparator is connected to the other end of the resistor. RS1 via a reference power supply REFH. The reference power supply REFH is set so that, when an overcurrent which exceeds the allowable current flows through the resistor RS1, the output of the comparator CM11 is inverted. An output of the comparator CM11 is connected to a negative logic input of the AND gate; circuit AN1 via the latch LA1. The other driving circuit 303LJ is configured by a comparator CM2, an AND gate circuit AN2, a buffer B24, a reference power supply REFL, a comparator CM21, and a latch LA2. These components correspond to the comparator CM1, the AND gate circuit AN1, and the buffer B14, the reference power supply REFH, the comparator CM11, and the latch LA1 which constitute the above-mentioned driving circuit 303HJ, respectively.

An operation of detecting an overcurrent will be described. When an overcurrent occurs in the power-MOS transistor 401, for example, a voltage is generated across the ends of the resistor RS1. When the voltage exceeds the voltage of the reference power supply REFH, the output of the comparator CM11 has a high level. The high level is latched by the latch LA1, and then supplied to the negative logic input of the AND gate circuit AN1. Therefore, the output signal of the AND gate circuit AN1 is set to a low level, and then supplied to the gate of the power-MOS transistor. 401 via the buffer B14. As a result, the power-MOS transistor 401 is controlled to the off state, whereby the overcurrent is interrupted. Consequently, the power-MOS transistor 401 is protected from the overcurrent. When an overcurrent flows through the power-MOS transistor 402, similarly, a voltage is generated across the ends of the resistor RS2. When the voltage exceeds the voltage of the reference power supply REFL, the output of the comparator CM21 has a high level, and the high level is supplied to the negative logic input of the AND gate circuit AN2. Therefore, the output signal of the AND gate circuit AN2 is set to a low level, and the power-MOS transistor 402 is controlled to the off state.

In the conventional art of protecting an output stage from an overcurrent, the driving circuits 303HJ and 303LJ separately detect an overcurrent to control the power-MOS transistors 401 and 402. Therefore, an operation status where only one of the power-MOS transistors is controlled to the off state and the other power-MOS transistor is set to an operable state may occur. Such a status is not preferable in the operation of a system in which the class D amplifier is mounted.

SUMMARY OF THE INVENTION

The invention has been conducted in view of the circumstances. It is an object of the invention to provide a class D amplifier in which, even when an overcurrent occurs only in one of power-MOS transistors constituting an output stage, both the power-MOS transistors can be controlled to the off state.

In order to solve the aforesaid object, the invention is characterized by having the following arrangement.
Aspect 1. A class D amplifier comprising:
a modulating circuit which modulates a input signal into a pulse signal;
a first driving circuit which drives a first output transistor which outputs a signal level corresponding to a high power supply to an output terminal;
a second driving circuit which drives a second output transistor which outputs a signal level corresponding to a lower power supply to the output terminal,
wherein the pulse signal is supplied to the first and second driving circuits to complementarily drive the first and second output transistors;
a first detecting circuit disposed in the first driving circuit, which detects an overcurrent flowing through the first, output transistor to output a first signal;
a second detecting circuit disposed in the second driving circuit, which detects an overcurrent flowing through the second output transistor to output a second signal; and
a gate circuit which, in response to one of the first and second signals, blocks the pulse signal to be input to the first and second driving circuits.
Aspect 2. The class D amplifier according to the aspect 1 further comprising:
a signal converting circuit which converts the first signal to a third signal based on the lower power supply; and
an adding circuit which adds together the second signal and the third signal,
wherein the gate circuit which, in response to an output signal of the adding circuit, blocks the pulse signal to be input to the first and second driving circuits.
Aspect 3. The class D amplifier according to the aspect 2, wherein the first driving circuit is operated by a first internal power supply based on a potential of the output terminal to drive the first output transistor, and
the second driving circuit is operated by a second internal power supply based on the lower power supply to drive the second output transistor.
Aspect 4. The class D amplifier according to the aspect 2, wherein the signal converting circuit includes:
a first transistor which is conductive in response to the first signal, one end of a current path thereof being connected to a power supply of the first driving circuit,
a load element connected between the other end of the current path of the first transistor and the lower power supply, and
a second transistor which is conductive in response to a signal that appears between the first transistor and the load element, a current path being connected between the lower power supply and an input of the adding circuit.
Aspect 5. The class D amplifier according to the aspect 4, wherein the first transistor is pnp bipolar transistor and the second transistor is npn bipolar transistor.

DETAILED DESCRIPTION OF PREFERRED EMBODIMENTS

Hereinafter, an embodiment of the invention will be described with reference to the accompanying drawings.

Figure 1:
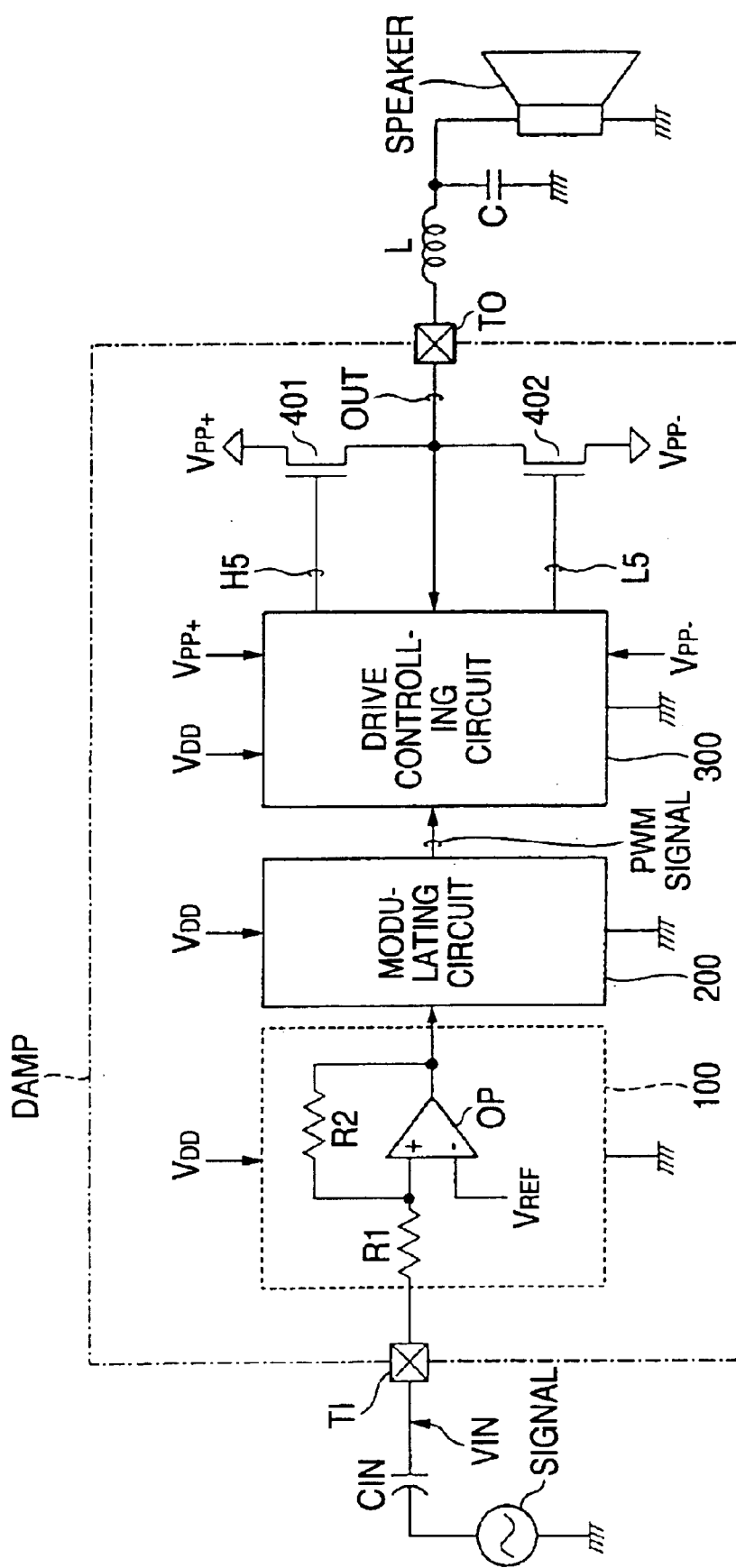
FIG. 1 is a diagram showing the configuration of a class D amplifier of an embodiment of the invention.

FIG. 1 shows the configuration of a class D amplifier DAMP of the embodiment. An input stage 100 is configured by an input resistor R1, a feedback resistor R2 (=R1), and an operational amplifier OP. One end of the input resistor R1 is connected to the inverting input (−) of the operational amplifier OP, and the other end of the resistor to an input terminal T1. A feedback resistor R2 is connected between the inverting input and the output of the operational amplifier OP. A reference voltage VREF is applied to the non-inverting input (+) of the operational amplifier OP. The reference voltage VREF is generated by, for example, resistance-dividing a voltage which is supplied from a standard power supply VDD, and set to one half of the voltage of the power supply VDD. In the embodiment, the voltage of the power supply VD is "+10 V", or a standard power supply voltage in the art. A modulating circuit 200 converts a music signal output from the preceding input stage 100 by the PWM modulation to a pulse signal (PWM signal). A drive controlling circuit 300 complementarily drives and controls output power-MOS transistors 401 and 402. The drive controlling circuit 300 will be described in detail later.

The power-MOS transistor 401 is used for outputting a high level to an output terminal TO, and the drain and the source are connected to a positive power supply VPP+ (high power supply) and the output terminal TO, respectively. The other power-MOS transistor 402 is used for outputting a low level to the output terminal TO, and the drain and the source are connected to the output terminal TO and a negative power supply VPP– (low power supply), respectively. In the embodiment, the voltage of the positive power supply VPP+ is "+0.50V", and that of the negative power supply VPP– is "–50 V". One of input terminals of a loudspeaker SPK is connected to the output terminal TO via a low-pass filter consisting of an inductor L and a capacitor C, and the other input terminal of the loudspeaker SPK is grounded. The constant of the low-pass filter consisting of the inductor L and the capacitor C is set so that the carrier frequency component is removed away from the pulse signal which is output from the class D amplifier DAMP via the output terminal TO, and music signal components are passed through the filter.

As described above, the class D amplifier DAMP is operated by the three power supplies, i.e., the standard power supply VDD, the positive power supply VPP+, and the negative power supply VPP–.

Figure 2:
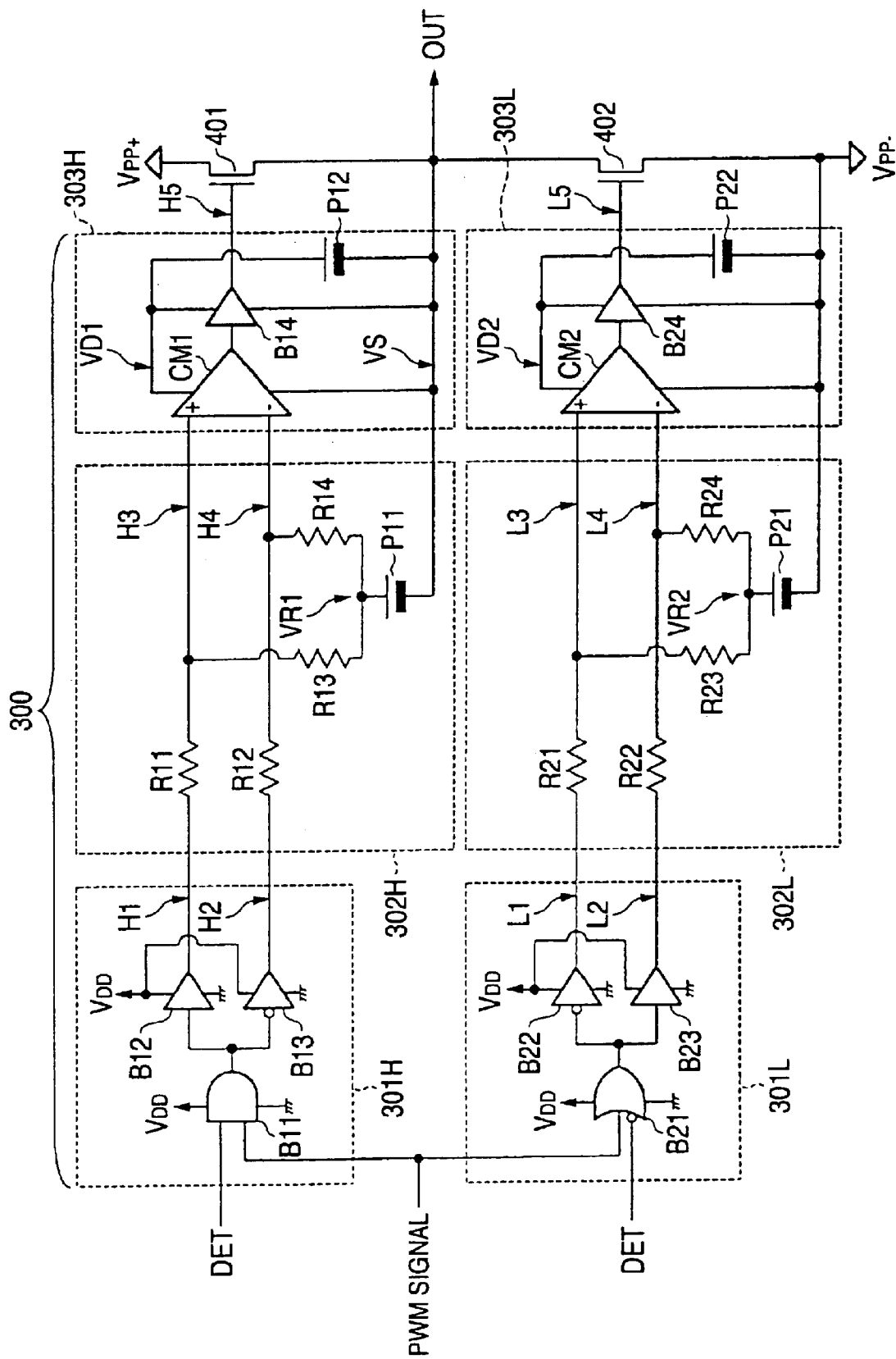
FIG. 2 is a circuit diagram showing the configuration of a drive controlling circuit in the embodiment.

Next, the configuration of the drive controlling circuit 300 will be described in detail. FIG. 2 shows the configuration of the drive controlling circuit 300. In the figure, portions for detecting and processing an overcurrent are not shown (the portions will be described later). The components identical with those shown in FIG. 1 are denoted by the same reference numerals. The drive controlling circuit 300 comprises a complementary signal generating circuit 301H, a signal converting circuit 302H, and a driving circuit 303H which serve as a circuit system (high-side driver) for driving the power-MOS transistor 401 which is one of the transistors constituting the output stage, and a complementary signal generating circuit 301L, a signal converting circuit 302L, and a driving circuit 303L which serve as a circuit system (low-side driver) for driving the power-MOS transistor 402 which is the other one of the transistors. A signal appearing at the node of the source of the power-MOS transistor 401 and the drain of the power-MOS transistor 402 is used as the output signal OUT of the class D amplifier DAMP to be output to the outside via the output terminal TO.

The configuration of the high-side driver will be described in detail. The complementary signal generating circuit 301H generates an positive-phase signal H1 and an, negative-phase signal H2 with respect to the PWM signal output from the above-mentioned modulating circuit 200, and is configured by an AND gate circuit B11 of the CMOS (Complementary Metal Oxide Semiconductor), a buffer B12, and a negative logic input type buffer (inverter) B13. The PWM signal output from the modulating circuit 200 is supplied to an input of the AND gate circuit B11, and an output of the gate circuit is connected to inputs of both the buffers B12 and B13. The AND gate circuit B11 and the buffers B12 and B13 are supplied with the power supply VDD to operate, and the buffers B12 and B13 output the positive-phase signal H1 and the negative-phase signal H2 with respect to the PWM signal, respectively. The positive-phase signal H1 and the negative-phase signal H2 are output as complementary signals (H1, H2) to the signal converting circuit 302H.

The signal converting circuit 302H converts the positive-phase signal H1 and the negative-phase signal H2 to an positive-phase signal H3 and an negative-phase signal H4 which follow a predetermined voltage VR1 based on the source voltage VS of the power-MOS transistor 401 (i.e., the signal level of the output signal OUT). The signal converting circuit is configured by resistors R11 and R12, resistors R13 and R14, and a biasing circuit P11. Ends of the resistors R13 and R14 on one side are connected to paired inputs of a comparator CM1, and the other ends of the resistors are biased by the biasing circuit P11 to the predetermined voltage VR1 based on the source voltage VS of the power-MOS transistor 401. In the embodiment, the predetermined voltage VR1 is set to a value (=VS+VDD/2) which is obtained by adding one half of the power supply VDD to the source voltage VS. Since the power supply VDD is 10 V, a voltage which is obtained by adding one half of the power supply, or 5 V to the source voltage VS is the predetermined voltage VR1.

Figure 3:
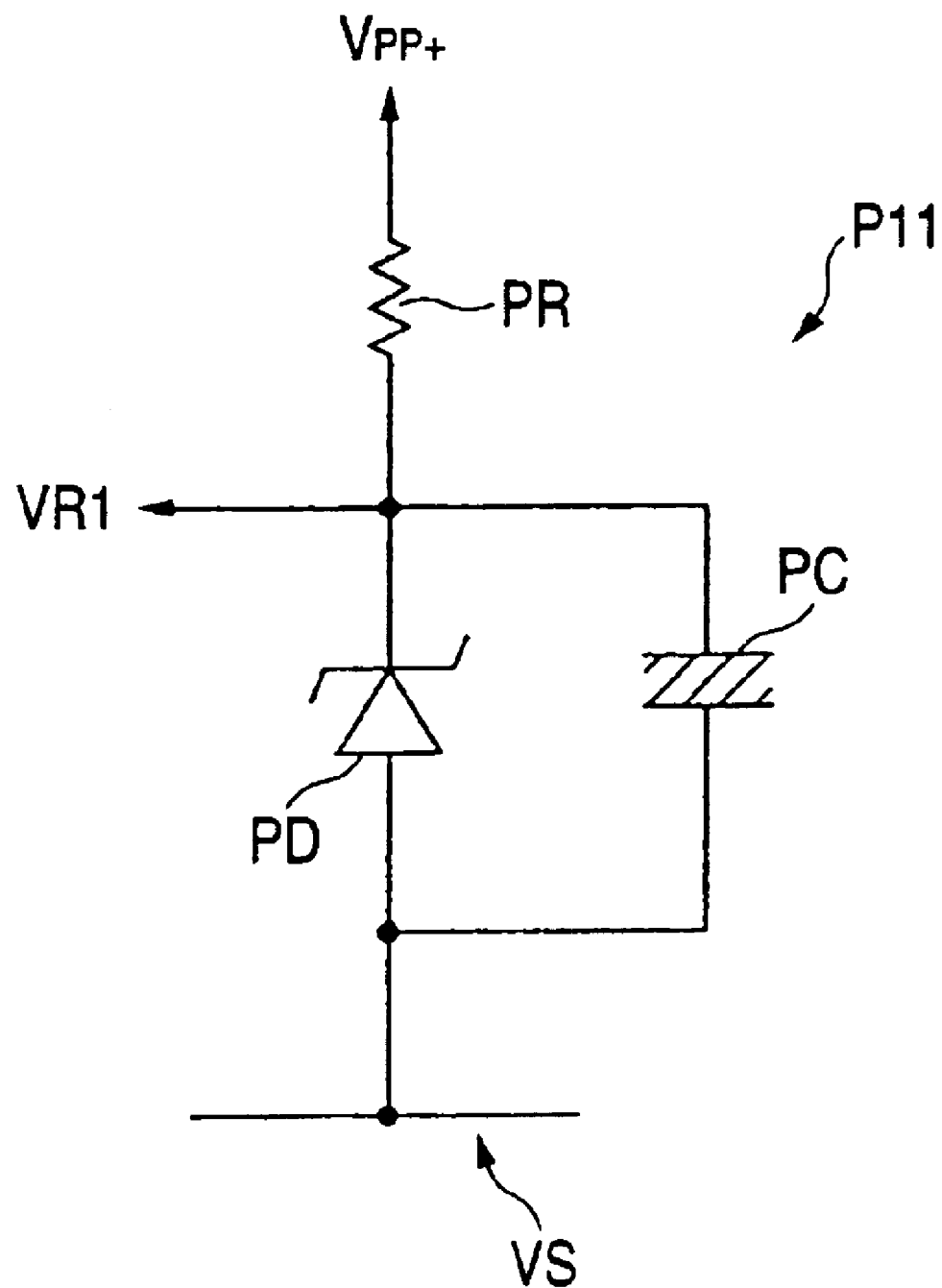
FIG. 3 is a diagram showing the configuration of a biasing circuit in the embodiment.

FIG. 3 is an example of the configuration of the biasing circuit P11. As shown in the figure, the biasing circuit P11 is configured by connecting in series a resistor PR and a Zener diode PD between the node where the above-mentioned source voltage VS appears (i.e., the source of the power-MOS transistor 401) and the positive power supply VPP+, and connecting a stabilizing capacitor PC in parallel with the Zener diode PD. A voltage appearing at the node of the resistor PR and the Zener diode PD is used as the predetermined voltage VR1. In the embodiment, the breakdown voltage of the Zener diode PD is set to 5 V which corresponds to one half of the power supply VDD (10 V). As a result, the voltage of a value (=VS+VDD/2) which is obtained by adding one half of the power supply VDD to the source voltage VS is generated as the predetermined voltage VR1.

Referring again to FIG. 2, the configuration of the driving circuit 303H will be described. The driving circuit 303H drives and controls the power-MOS transistor 401, and includes the comparator CM1, a buffer B14, and an internal power supply P12. The non-inverting input of the comparator CM1 is connected to the output of the buffer B12 via the resistor R11, and the inverting input of the comparator is connected to the output of the buffer B13 via the resistor R12. An output of the comparator CM1 is connected to an input of the buffer 14, and an output of the buffer B14 is connected to the gate of the power-MOS transistor 401.

The internal power supply P12 generates a voltage VD1 which corresponds to the voltage of the power supply VDD, based on the source voltage VS of the power-MOS transistor 401, and is configured in a basically identical manner as the biasing circuit shown in FIG. 3. In the internal power supply, however, the breakdown voltage of the Zener diode PD is set to 10 V which corresponds to the voltage of the power supply VDD. The internal power supply P12 generates the voltage VD1 which corresponds to the voltage of the power supply VDD, based on the source voltage VS, and supplies the generated voltage to the comparator CM1 and the buffer B14 as a power supply voltage. Therefore, the power supply system of the driving circuit 303H is changed with following the source voltage VS of the power-MOS transistor 401, and functions as a power supply which is equivalent to the power supply VDD as far as the comparator CM1 and the buffer B14 are concerned. In the above, the configuration of the high-side driver for driving the power-MOS transistor 401 has been described.

Next, the configuration of the low-side driver for driving the power-MOS transistor 402 will be described. A complementary signal generating circuit 301, a signal converting circuit 302L, and a driving circuit 303L which constitute the low-side driver are configured in a basically identical manner as the complementary signal generating circuit 301H, the signal converting circuit 302H, and the driving circuit 303H which constitute the above-described high-side driver. However, an OR gate circuit B21 is disposed as a component corresponding to the AND gate circuit B11. Specifically, the signal generating circuit 301L generates an negative-phase signal L1 and an positive-phase signal L2 with respect to the PWM signal which is output from the modulating circuit 200, and is configured by the OR gate circuit B21 and buffers B22 and B23. These components correspond to the AND gate circuit B11 and the buffers B12 and B13 which constitute the signal generating circuit 301H, respectively. In contrast to that the buffers B12 and B13 are respectively of the positive logic input type and the negative logic input type, the buffers B22 and B23 are respectively of the negative logic input type and the positive logic input type.

The signal converting circuit 302L is configured by resistors R21, R22, R23, and R24, and a biasing circuit P21. These components correspond to the resistors R11, R12, R13, and R14, and the biasing circuit P11 which constitute the above-described signal converting circuit 302H, respectively. However, the biasing circuit P21 generates a voltage VR2 which corresponds to one half of the power supply VDD, based on the negative power supply VPP−. The driving circuit 303L includes a comparator CM2, a buffer B24, and an internal power supply P22. These components correspond to the comparator CM1, the buffer B14, and the internal power supply P12 which constitute the driving circuit 303H, respectively. However, the internal power supply P22 generates a voltage VD2 which corresponds to the power supply VDD, based on the source voltage (i.e., the negative power supply VPP−) of the power-MOS transistor 402, and supplies the generated voltage to the comparator CM2 and the buffer B24 as a power supply voltage.

Figure 4:
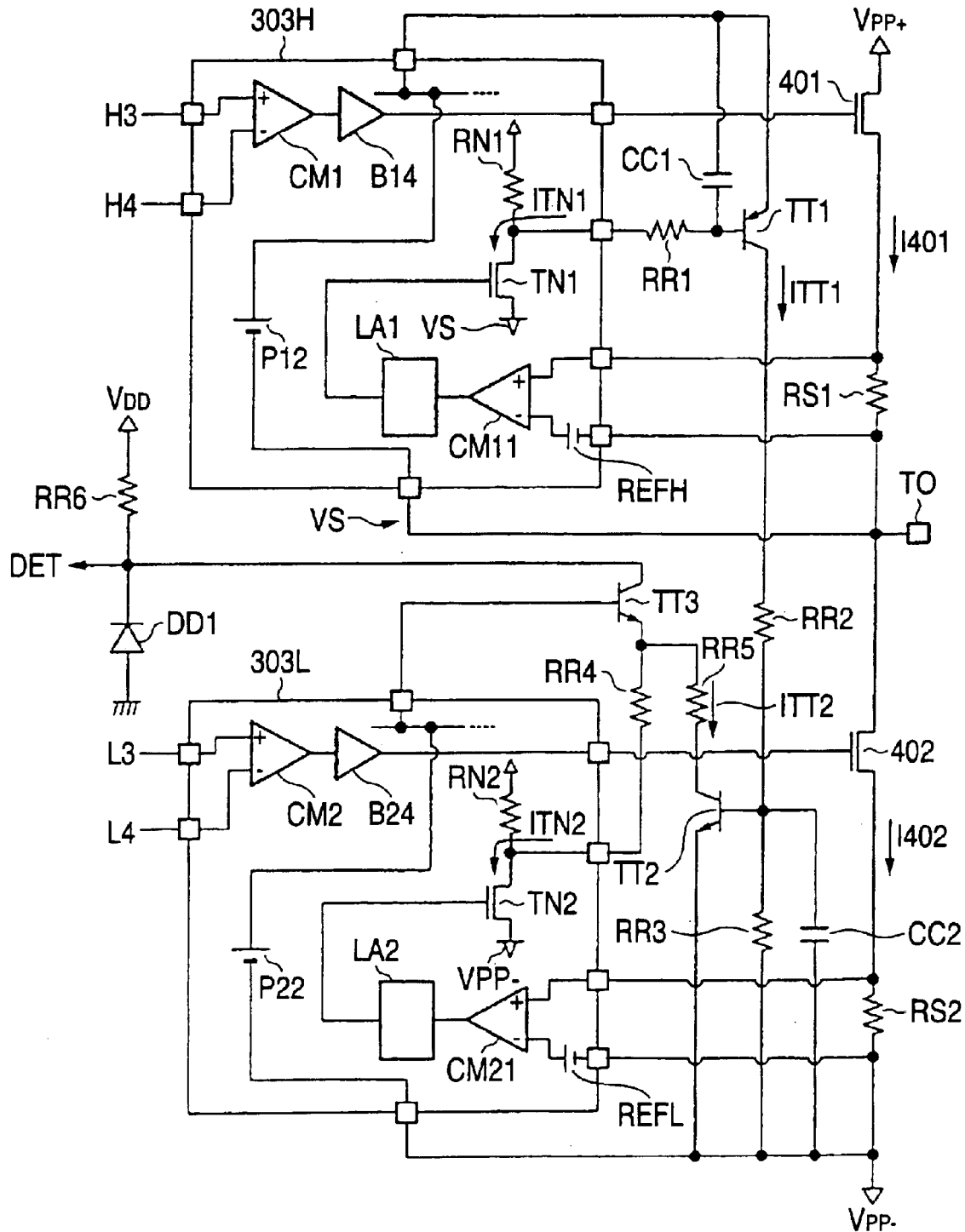
FIG. 4 is a circuit diagram showing a characteristic portion of the embodiment and depicting the configuration for protecting power-MOS transistors from an overcurrent.

Next, the circuit configuration for protecting the power-MOS transistors 401 and 402 in the output stage from an overcurrent will be described with reference to FIG. 4. In FIG. 4, the components identical with those shown in FIG. 2 are denoted by the same reference numerals. A resistor RS1 for detecting an overcurrent I401 of the power-MOS transistor 401 is connected between the source of the power-MOS transistor 401 and the output terminal TO. In the driving circuit 303H, a reference power supply REFH, a comparator CM11, a latch LA1, an NMOS transistor TN1, and a resistor RN1 are disposed so as to constitute a circuit (first detecting circuit) for detecting the overcurrent I401 of the power-MOS transistor 401. The non-inverting input (+) of the comparator CM11 is connected to a side (the side of the power-MOS transistor 401) of one end of the resistor RS1, and the inverting input (−) is connected to the side (the side of the output terminal TO) of the other end of the resistor RS1 via the reference power supply REFH. An output of the comparator CM11 is connected to an input of the latch LA1, and an output of the latch LA1 is connected to the gate of the NMOS transistor TN1. The source of the NMOS transistor TN1 is connected to the source voltage VS, and the load resistor RN1 is connected between the drain of the transistor and the internal power supply P12.

A resistor RS2 for detecting an overcurrent I402 of the power-MOS transistor 402 is connected between the source of the power-MOS transistor 402 and the negative power supply VPP−. In the driving circuit 303L, a reference power supply REFL, a comparator CM21, a latch LA2, an NMOS transistor TN2, and a resistor RN2 are disposed so as to constitute a circuit (second detecting circuit) for detecting the overcurrent of the power-MOS transistor 402. The non-inverting input (+) of the comparator CM21 is connected to a side (the side of the power-MOS transistor 402) of one end of the resistor RS2, and the inverting input (−) is connected to the side (the side of the negative power supply VPP−) of the other end of the resistor RS2 via the reference power supply REFL. An output of the comparator CM21 is connected to an input of the latch LA2, and an output of the latch is connected to the gate of the NMOS transistor TN2. The source of the NMOS transistor TN2 is connected to the negative power supply VPP−, and the load resistor RN2 is connected between the drain of the transistor and the internal power supply P22. The drain of the NMOS transistor TN2 is connected to the emitter of an npn bipolar transistor TT3 via a resistor RR4.

The emitter of a pnp bipolar transistor TT1 is connected to the internal power supply P12 of the driving circuit 303H, and the base of the transistor is connected to the drain of the NMOS transistor TN1 via a resistor RR1. The collector of the pnp bipolar transistor TT1 is connected to the negative power supply VPP− via resistors RR2 and RR3. A stabilizing capacitor CC1 is connected between the base of the pnp bipolar transistor TT1 and the internal power supply P12. The base of an npn bipolar transistor TT2 is connected between the pnp bipolar transistor TT1 and the resistor RR3 (specifically, to the node of the resistors RR2 and RR3), the emitter of the transistor is connected to the negative power supply VPP−, and the collector is connected to the emitter of the npn bipolar transistor TT3 via a resistor RR5. The collector of the npn bipolar transistor TT3 is connected to the power supply VDD of the above-described signal generating circuits 301H and 301L.

The anode of a diode DD1 is grounded, and the cathode of the diode is connected to the collector of the npn bipolar transistor TT3. A voltage signal appearing at the node of a resistor RR6 and the cathode of the diode DD1 is used as a detection signal DET indicating that an overcurrent is detected. The voltage signal is output to the signal generating circuits 301H and 301L.

Figure 5:
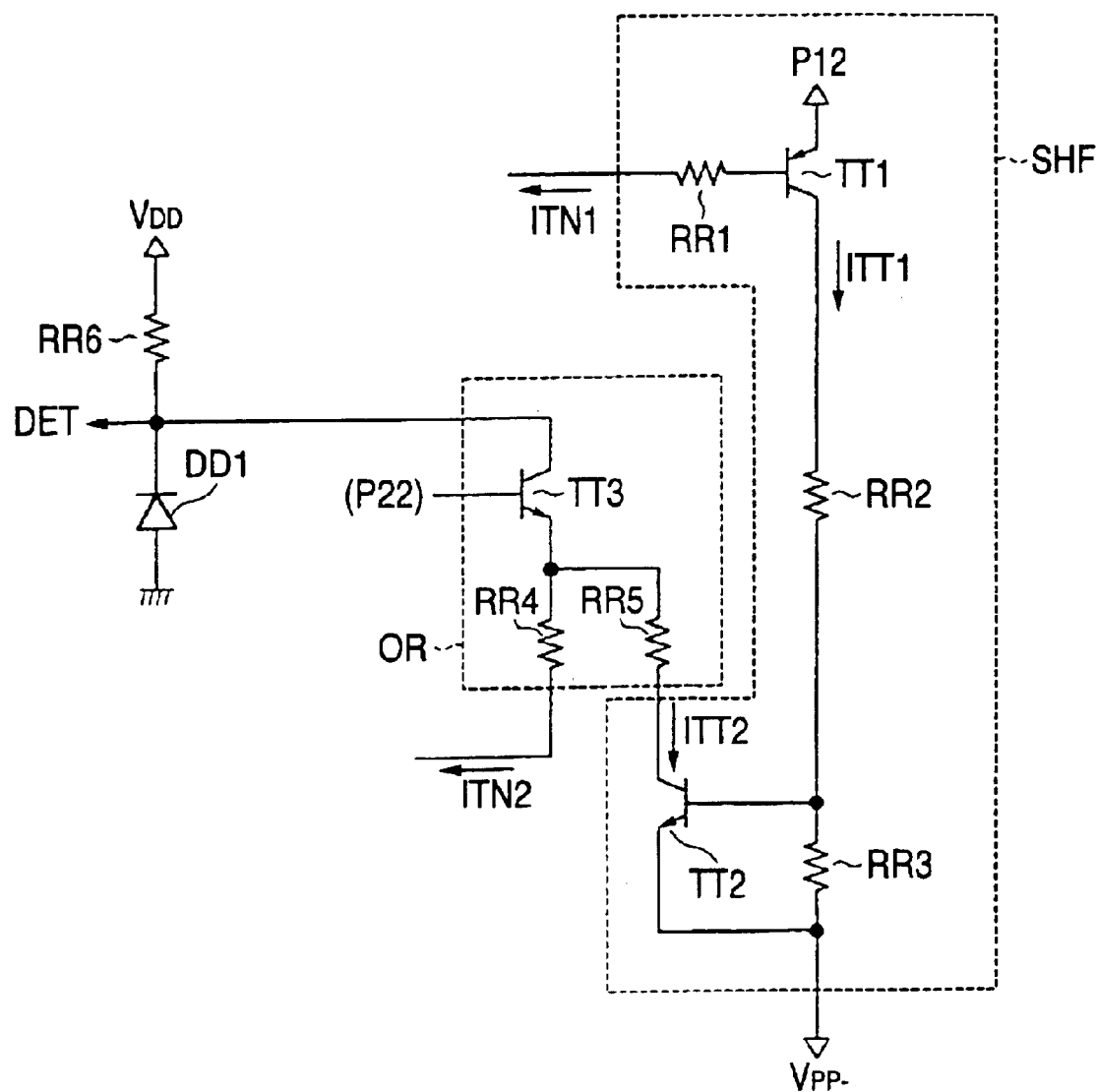
FIG. 5 is a circuit diagram selectively showing the characteristic portion of the embodiment.

FIG. 5 is a view selectively showing a circuit system which is used for generating the detection signal DET from the drain currents of the NMOS transistors TN1 and TN2 in the driving circuits 303H and 303L shown in FIG. 4. Referring to the figure, the resistors RR1, RR2, and RR3, and the pnp bipolar transistor TT1 constitute a signal converting circuit SHF for converting the drain current of the NMOS transistor TN1 to a current signal ITT2 based on the negative power supply VPP−. The resistors RR4 and RR5, and the npn bipolar transistor TT3 constitute an adding circuit OR which adds together a drain current ITN2 of the NMOS transistor TN2 and the current signal ITT2. In other words, a high/low voltage (VD1) based on the source voltage VS is converted to a high/low voltage based on the negative power supply VPP−.

Next, the operation of the embodiment will be described.

Figure 6:
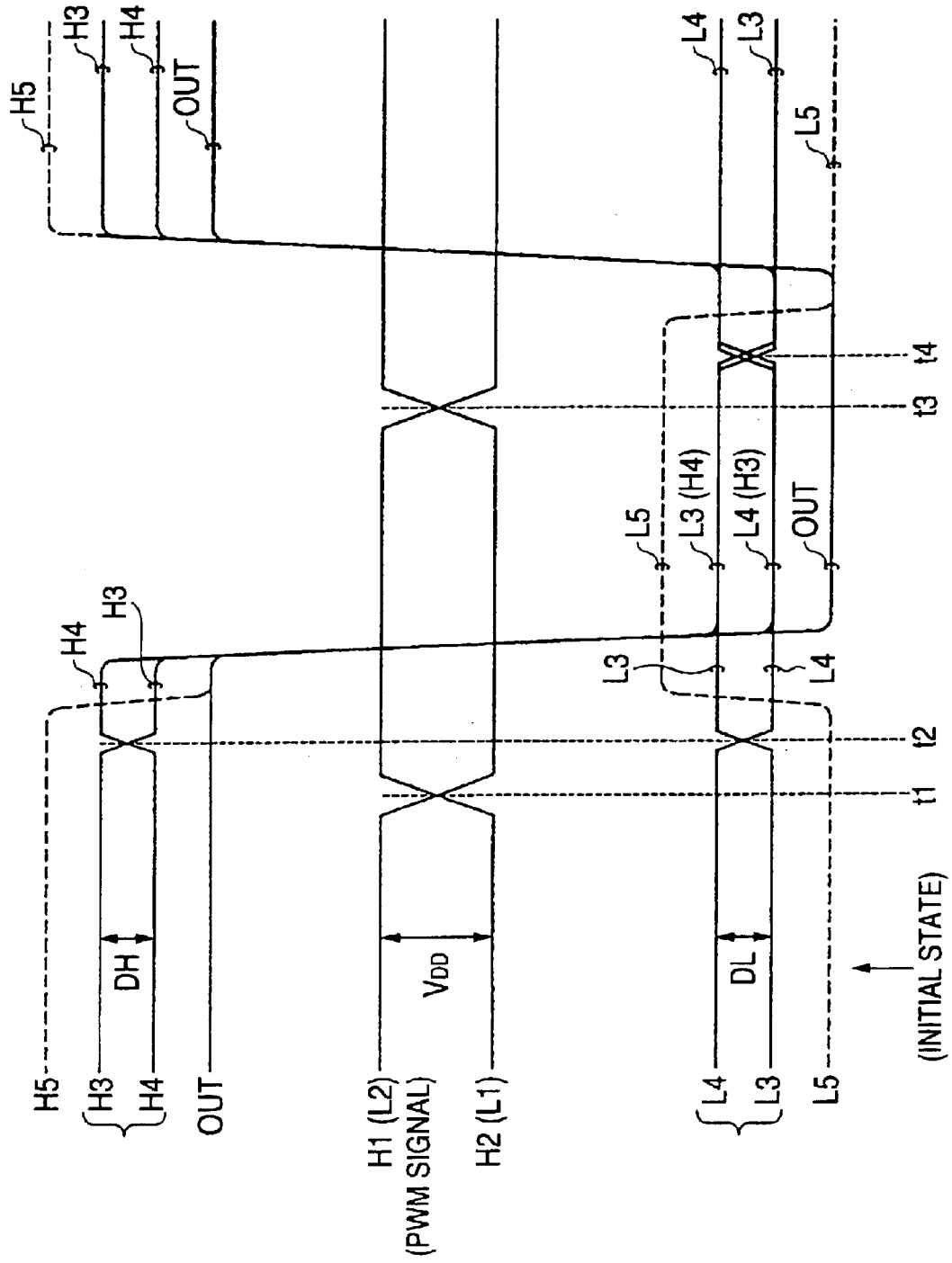
FIG. 6 is a waveform chart illustrating the operation of the class D amplifier of the embodiment.
Figure 7:
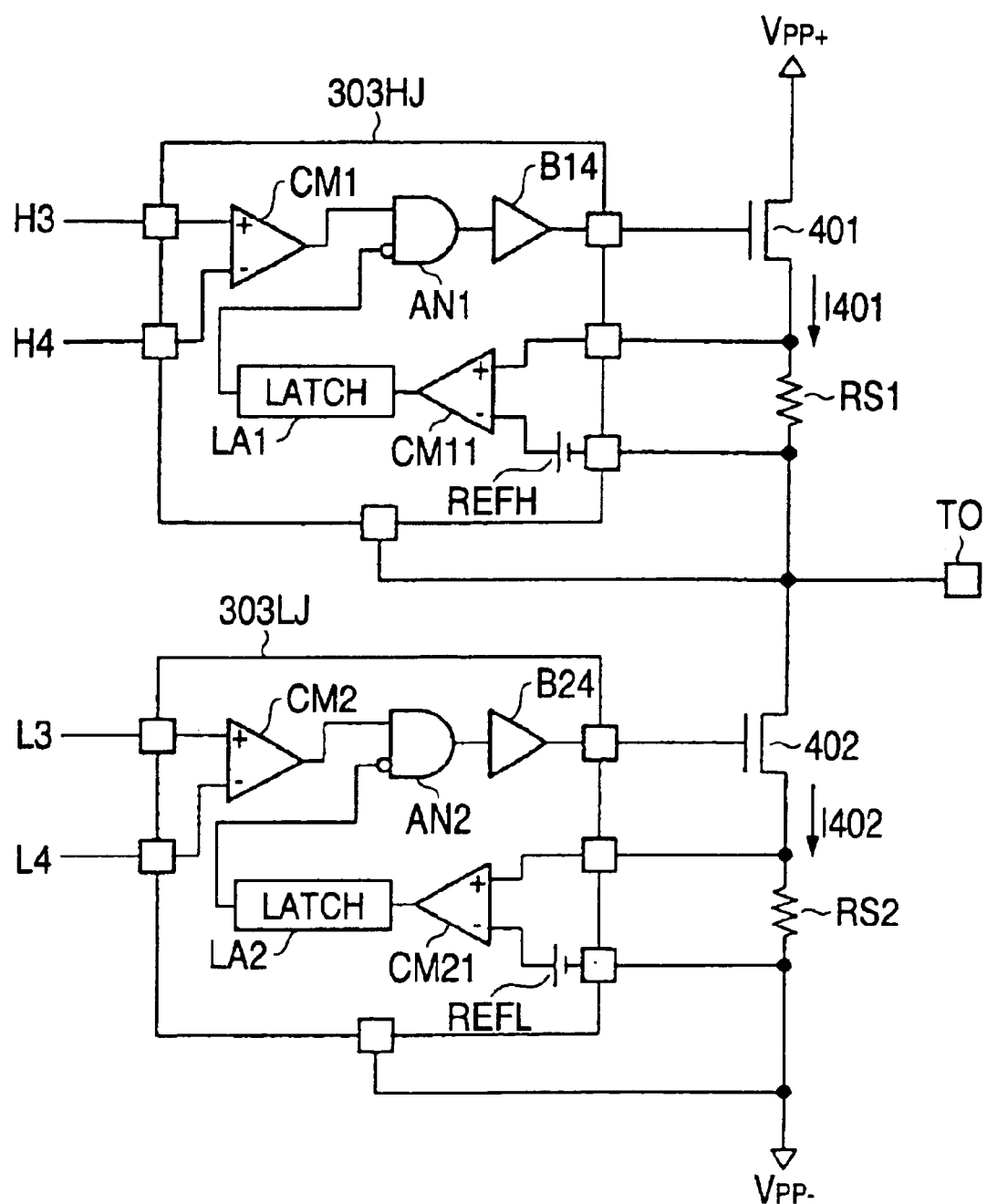
FIG. 7 is a diagram shows a configuration for protecting an output stage from an overcurrent.

First, the operation as an amplifier will be described with reference to a waveform chart shown in FIG. 6. In FIG. 6, the PWM signal output from the modulating circuit 200 is expressed with using the waveform of the positive-phase signal H1 because the PWM signal is positive-phase with the positive-phase signal H1. The input stage 100 shown in FIG. 1 functions as an inverting amplifier of an amplification factor. (R2/R1) of "1", to output a signal in which the phase of the music signal VIN is inverted while setting the reference voltage VREF as the midpoint. As a result, the music signal VIN is converted to a signal conforming to the input characteristics of the modulating circuit 200 in the subsequent stage. The modulating circuit 200 performs PWM-modulation while reflecting information components of the music signal output from the previous input stage 100 to the pulse width, thereby generating a PWM signal. On the basis of the PWM signal generated by the modulating circuit 200, the drive controlling circuit 300 complementarily drives the output power-MOS transistors 401 and 402.

The operation of the drive controlling circuit 300 will be described in more detail. In response to the PWM signal output from the modulating circuit 200, the signal generating circuit 301H constituting the high-side driver generates the positive-phase signal H1 having the same phase as that of the PWM signal, and the negative-phase signal H2 having the phase opposite to that of the PWM signal. In the waveform chart shown in FIG. 6, in the initial state, the PWM signal output from the modulating circuit 200 is at the high level, and the complementary signal generating circuit 301H which receives the signal outputs the high level as the positive-phase signal H1, and the low level as the negative-phase signal H2. In the initial state, therefore, a level difference corresponding to the power supply VDD exists between the positive-phase signal H1 and the negative-phase signal H2, and the positive-phase signal H1 is higher than the negative-phase signal H2 by a voltage corresponding to the power supply VDD.

The positive-phase signal H1 and the negative-phase signal H2 which are output from the complementary signal generating circuit 301H are supplied as the positive-phase signal H3 and the negative-phase signal H4 toward the driving circuit 303H via the resistors R11 and R12 constituting the signal converting circuit 302H. At this time, the inputs of the comparator CM1 constituting the driving circuit 303H are connected to the biasing circuit P11 via the resistors R13 and R14. Therefore, the level of the positive-phase signal H3 indicates the voltage which is obtained by dividing the potential difference between the voltage VR1 generated by the biasing circuit P11 and the positive-phase signal H1, by the resistors R11 and R13, and that of the negative-phase signal H4 indicates the voltage which is obtained by dividing the potential difference between the voltage VR1 and the negative-phase signal H2, by the resistors R12 and R14.

The comparator CM1 of the driving circuit 303H outputs a signal level corresponding to the level relationship between the positive-phase signal H3 and the negative-phase signal H4. In the initial state, since the level of the positive-phase signal H3 is higher than that of the negative-phase signal H4, the comparator CM1 outputs the high level, and the buffer B14 which receives the high level outputs a signal H5 of a level which corresponds to the power supply VDD based on the source of the power-MOS transistor 401, to the gate of the transistor. As a result, the power-MOS transistor 401 is set to the on state. As described later, since the power-MOS transistors 401 and 402 are controlled so as to become complementarily conductive, the power-MOS transistor 402 is in the off state when the power-MOS transistor 401 is in the on state, so that the level (i.e., the source voltage VS) of the output signal OUT is raised to the voltage of the positive power supply VPP+.

At this time, the driving circuit 303H is supplied with the voltage VD1 based on the source voltage VS from the internal power supply P12, and hence the power supply system of the driving circuit 303H is raised with following the source voltage VS of the power-MOS transistor 401. Therefore, also the input threshold of the comparator CM1 is raised together with the source voltage VS. However, also the voltage VR1 generated by the biasing circuit P11 is raised with following the source voltage VS. Therefore, the levels of the positive-phase signal H3 and the negative-phase signal H4 maintain the state conforming to the input characteristics of the comparator CM1 constituting the driving circuit 303H, and the power-MOS transistor 401 is kept to the on state. Under this state, the level of the signal H5 is higher than the positive power supply VPP+ by the voltage VD1 (=VDD)

In the low-side driver, the complementary signal generating circuit 301L which receives the PWM signal that is at the high level in the initial state outputs the low level as the negative-phase signal L1, and the high level as the positive-phase signal L2. In the initial state, therefore, a level difference corresponding to the power supply VDD exists between the negative phase signal L1 and the positive-phase signal L2 depending on the level relationship, and the negative-phase signal L1 is lower than the positive-phase signal L2 by a voltage corresponding to the power supply VDD. The negative-phase signal L1 and the positive-phase signal L2 which are output from the complementary signal generating circuit 301L are supplied as the negative-phase signal L3 and the positive-phase signal L4 toward the driving circuit 303L via the resistors R21 and R22 constituting the signal converting circuit 302L. At this time, the level of the negative-phase signal L3 indicates the voltage which is obtained by dividing the potential difference between the voltage VR2 generated by the biasing circuit P21 and the negative-phase signal L1, by the resistors R21 and R23, and that of the positive-phase signal L4 indicates the voltage which is obtained by dividing the potential difference between the voltage VR2 and the positive-phase signal L2, by the resistors R22 and R24.

In the initial state, since the level of the negative-phase signal L3 is lower than that of the positive-phase signal L4, the comparator CM2 of the driving circuit 303L outputs the low level, and the buffer B24 which receives the low level outputs a signal L5 of a level which is equal to the source voltage (VPP−) of the power-MOS transistor 402, to the gate of the transistor. Therefore, the power-MOS transistor 402 is set to the off state. At this time, the internal power supply P22 generates the voltage VD2 based on the negative power supply VPP−. In the initial state, consequently, the power-MOS transistor 401 is in the on state, and the power-MOS transistor 402 is in the off state, thereby producing a state where the high level corresponding to the voltage of the positive power supply VPP+ is output as the output signal OUT.

When the PWM signal is transferred at time t1 shown in FIG. 6 from the initial state to the low level, the positive-phase signal H1 becomes the low level, and the negative-phase signal H2 becomes the high level in response to this transfer. Therefore, the level relationship between the positive-phase signal H1 and the negative-phase signal H2 is inverted, and also that between the positive-phase signal H3 and the negative-phase signal H4 is inverted at time t2. Consequently, the output signal of the comparator CM1 which receives the positive-phase signal H3 and the negative-phase signal H4 is changed from the high level (VS=a voltage state which is higher by the voltage VD1 than the positive power supply VPP+) to the low level (VS=a voltage state which corresponds to the positive power supply VPP+), and also the output signal H5 of the buffer B14 which receives the output signal is changed to the low level (VS=a voltage state which corresponds to the positive power supply VPP+). As a result, the gate voltage of the power- MOS transistor 401 becomes equal to the source voltage VS (=the positive power supply VPP+), and the power-MOS transistor 401 is set to the off state.

On the other hand, when the PWM signal is transferred at time t1 to the low level, the negative-phase signal L1 becomes the high level, and the positive-phase signal L2 becomes the low level in response to this transfer. Therefore, the level relationship between the negative-phase signal L1 and the positive-phase signal L2 is inverted, and also that between the negative-phase signal L3 and the positive-phase signal L4 is correspondingly inverted. Consequently, the output signal of the comparator CM2 is changed from the low level (a voltage state which corresponds to the negative power supply VPP−) to the high level (a voltage state which is higher by the voltage VD2 than the negative power supply VPP−), and also the output signal L5 of the buffer B24 which receives the output signal is changed to the high level. As a result, the gate voltage of the power-MOS transistor 402 becomes higher than the source voltage by the voltage VD2, and the power-MOS transistor 402 is set to the on state.

When the power-MOS transistor 402 is set to the on state, the source voltage VS of the power-MOS transistor 401 is lowered in accordance with the output signal OUT, and also the voltage VD1 which is generated by the internal power supply P12 based on the voltage is lowered. At this time, also the voltage VR1 generated by the biasing circuit P11 is lowered in accordance with the change of the source voltage VS of the power-MOS transistor 401, and hence the levels of the positive-phase signal H1 and the negative-phase signal H2 are lowered together with the power supply system of the driving circuit 303H while the level relationship between the signals are maintained. Therefore, the signal output from the comparator CM1 is kept to the low level (the source voltage VS), and, during the process of transferring the output signal OUT to the low level (the negative power supply VPP−), the off state of the power-MOS transistor 401 is maintained.

As described above, when the PWM signal is transferred at time t1 from the initial state to the low level, one of the power-MOS transistors, or the power-MOS transistor 401 is set to the off state, and the other power-MOS transistor 402 is set to the on state, so that the output signal OUT is transferred from the positive power supply VPP+ to the negative power supply VPP− and the low level is output.

When the PWM signal is returned at time t3 to the high level, the positive-phase signal H3 on the side of the high-side driver becomes the high level, and the negative-phase signal H4 becomes the low level at time 4 in response to this transfer. Therefore, the comparator CM1 which receives the positive-phase signal H3 and the negative-phase signal H4 outputs the high level, and the power-MOS transistor 401 is set to the on state. In the low-side driver, the negative-phase signal L3 becomes the low level, and the positive-phase signal L4 becomes the high level. Therefore, the comparator CM2 which receives the negative-phase signal L3 and the positive-phase signal L4 outputs the low level, and the power-MOS transistor 402 is set to the off state When the power-MOS transistor 401 is set-to the on states the source voltage VS of the transistor is raised in accordance with the output signal OUT, and also the voltage VD1 which is generated by the internal power supply P12 based on the voltage is raised. However, also the voltage VR1 generated by the biasing circuit P11 is raised with following the source voltage VS, and the level relationship between the positive-phase signal H1 and the negative-phase signal H4 is maintained. Therefore, the level of the output signal of the comparator CM1 is kept to the high level (the voltage state which is higher than the source voltage VS by the voltage VD1). During the process of transferring the output signal OUT to the high level, therefore, the on state of the power-MOS transistor 401 is maintained. When the PWM signal becomes the high level at time t3, therefore, the power-MOS transistor 401 is set to the on state, and the power-MOS transistor 402 is set to the off state, so that the high level corresponding to the positive power supply VPP+ is output as the output signal OUT.

As a result, the pulse signal which is modulated on the basis of the music signal VIN is power-amplified and then output as the output signal OUT.

Next, the operation of protecting the power-MOS transistors in the output stage from an overcurrent will be described with reference to FIGS. 4 and 5.

In FIG. 4, it is assumed that the power-MOS transistor 401 is in the on state, and the output terminal is short-circuited to ground as a result of, for example, a short circuit of the load. In this case, the overcurrent 1401 flows from the positive power supply VPP+ to ground via the resistor RS1 and the output terminal TO, and a voltage drop occurs in the resistor RS1, so that a voltage is generated across the resistor RS1. When the voltage exceeds the voltage of the reference power supply REFH in the driving circuit 303H, the output signal of the comparator CM11 becomes the high level. The output signal is latched by the latch LA1 to be supplied to the gate of the NMOS transistor TN1. In response to this, the NMOS transistor TN1 becomes the on state, and a drain current ITN1 (the first signal) is generated.

When the drain current ITN1 is generated, the base voltage of the pnp bipolar transistor TT1 is driven to the low level via the resistor RR1, and the pnp bipolar transistor TT1 is set to the on state, so that a collector current ITT1 flows into the negative power supply VPP− via the resistors RR2 and RR3. This causes the base voltage of the npn bipolar transistor TT2 to be raised, and the npn bipolar transistor. TT2 is set to the on state, so that a collector current ITT2 (the third signal) is generated. As a result of the operations described above, the drain current ITN1 is converted to the collector current ITT2 which is a signal based on the negative power supply VPP−. When the collector current ITT2 flows, the emitter voltage of the npn bipolar transistor TT3 is lowered via the resistor RR5, and the npn bipolar transistor TT3 is set to the on state, whereby the resistor RR6 is driven. As a result, the detection signal DET becomes the low level to enter the signal state indicating that an overcurrent is detected. At this time, the level of the detection signal DET is clamped by the diode DD1 to an appropriate potential in the vicinity of the ground potential, so as not to be excessively lowered.

The detection signal DET is supplied to the AND gate circuit B11 and the OR gate circuit B21 which are shown in FIG. 2. The output signal of the AND gate circuit B11 to which the detection signal DET of the low level is input is, fixed to the low level, and the positive-phase signal H1 and the negative-phase signal H2 have the low level and the high level, respectively. The comparator CM1 to which these signals are input as the positive-phase signal H3 and the negative-phase signal H4 outputs the low level to the gate of the power-MOS transistor 401 via the buffer B14, thereby controlling the power-MOS transistor 401 to the off state.

By contrast, the output signal of the OR gate circuit B21 in which the detection signal DET of the low level is input to the negative logic input is fixed to the high level, and the negative-phase signal L1 and the positive-phase signal L2 have the low level and the high level, respectively. The comparator CM2 to which these signals are input as the negative-phase signal L3 and the positive-phase signal L4 outputs the low level to the gate of the power-MOS transistor 402 via the buffer B24, thereby controlling the power-MOS transistor 402 to the off state. In summary, the AND gate circuit B11 and the OR gate circuit B21 function as gate circuits which block the pulse signal in response to the detection signal DET.

When the overcurrent 1401 of the power-MOS transistor 401 is detected and the detection signal DET has the low level in this way, both the power-MOS transistors 401 and 402 are controlled to the off state.

Next, the case where the overcurrent 1402 occurs in the power-MOS transistor 402 will be described with reference to FIG. 4. In this case, a voltage is generated across the resistor RS2. When the voltage exceeds the voltage of the reference power supply REFL in the driving circuit 303L, the output signal of the comparator CM21 becomes the high level. The output signal is latched by the latch LA2 to be supplied to the gate of the NMOS transistor TN2 to set the NMOS transistor TN2 to the on state, whereby a drain current ITN2 (the second signal) is generated. As a result, the emitter of the npn bipolar transistor TT3 is driven to the low level via the resistor RR4, and the npn bipolar transistor TT3 is set to the on state. Therefore, the detection signal DET has the low level, and both the power-MOS transistors 401 and 402 are controlled to the off state.

As described above, when an overcurrent is detected in one or both of the power-MOS transistors 401 and 402, both the power-MOS transistors 401 and 402 are controlled to the off state, so that the power-MOS transistors are protected from an overcurrent. In the embodiment, therefore, the class D amplifier DAMP is set to a mute state, and it is possible to avoid a system disadvantage due to the phenomenon in which only one of the output transistors is operated. In the embodiment, even when the internal power supply system of the high-side driver is changed with following the potential of the output terminal TO, the signal (the drain current ITN1) detected by the driving circuit 303H in the high-side driver can be surely taken out, and the signal can be supplied as an error signal to a CPU or the like which controls the whole system. When an overcurrent occurs, for example, the operation of the whole system can be stopped.

Although an embodiment of the invention has been described above, the invention is not restricted to the embodiment and modifications and the like are included in the scope of the invention unless departing from the concept of the invention. In the embodiment described above, the drain current ITN1 output from the driving circuit 303H is converted to the collector current ITT2 based on the negative power supply VPP−. Alternatively, in the case where the internal power supply system of the driving circuit 303L is configured so as to follow the voltage of the output terminal, the drain current ITN2 output from the driving circuit 303L may be converted to a signal based on the positive power supply VPP+, and the signal may be added to the drain current ITN1 to generate the detection signal DET.

According to the invention, an overcurrent which flows through a first output transistor on the side of a high power supply constituting an output stage is detected to output a first signal, an overcurrent which flows through a second output transistor on the side of a low power supply constituting the output stage is detected to output a second signal, the first signal is converted to a third signal based on the low power supply, the second and third signals are added to each other, and a gate circuit which blocks a pulse signal to be input to the first and second driving circuits in response to the addition signal is disposed. Even when an overcurrent occurs only in one of power-MOS transistors constituting the output stage, therefore, both the power-MOS transistors can be controlled to the off state.

What is claimed is:

1. A class D amplifier comprising:
   a modulating circuit which modulates a input signal into a pulse signal;
   a first driving circuit which drives a first output transistor which outputs a signal level corresponding to a high power supply to an output terminal;
   a second driving circuit which drives a second output transistor which outputs a signal level corresponding to a lower power supply to the output terminal,
   wherein the pulse signal is supplied to the first and second driving circuits to complementarily drive the first and second output transistors;
   a first detecting circuit disposed in the first driving circuit, which detects an overcurrent flowing through the first output transistor to output a first signal;
   a second detecting circuit disposed in the second driving circuit, which detects an overcurrent flowing through the second output transistor to output a second signal; and
   a gate circuit which, in response to one of the first and second signals, blocks the pulse signal to be input to the first and second driving circuits.

2. The class D amplifier according to claim 1 further comprising:
   a signal converting circuit which converts the first signal to a third signal based on the lower power supply; and
   an adding circuit which adds together the second signal and the third signal,
   wherein the gate circuit which, in response to an output signal of the adding circuit, blocks the pulse signal to be input to the first and second driving circuits.

3. The class D amplifier according to claim 2, wherein the first driving circuit is operated by a first internal power supply based on a potential of the output terminal to drive the first output transistor, and
   the second driving circuit is operated by a second internal power supply based on the lower power supply to drive the second output transistor.

4. The class D amplifier according to claim 2, wherein the signal converting circuit includes:
   a first transistor which is conductive in response to the first signal, one end of a current path thereof being connected to a power supply of the first driving circuit,
   a load element connected between the other end of the current path of the first transistor and the lower power supply, and
   a second transistor which is conductive in response to a signal that appears between the first transistor and the load element, a current path being connected between the lower power supply and an input of the adding circuit.

5. The class D amplifier according to claim 4, wherein the first transistor is pnp bipolar transistor and the second transistor is npn bipolar transistor.

* * * * *